(12) United States Patent
Chen et al.

(10) Patent No.: US 8,971,267 B2
(45) Date of Patent: Mar. 3, 2015

(54) METHOD AND APPARATUS FOR COMPRESSING AND DECOMPRESSING IP DATA PACKET

(75) Inventors: Jun Chen, Shanghai (CN); Jieke Shi, Shanghai (CN); Lingli Pang, Shanghai (CN); Xiaoxiao Zheng, Shanghai (CN); Zhe Xu, Shenzhen (CN); Ming Wen, Shanghai (CN); Chao Wang, Shanghai (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 129 days.

(21) Appl. No.: 13/547,748

(22) Filed: Jul. 12, 2012

(65) Prior Publication Data
US 2012/0275424 A1  Nov. 1, 2012

Related U.S. Application Data

(63) Continuation of application No. PCT/CN2010/080574, filed on Dec. 31, 2010.

(30) Foreign Application Priority Data

Jan. 18, 2010 (CN) .......................... 2010 1 0003376

(51) Int. Cl.
*H04W 4/00* (2009.01)
*H04W 28/06* (2009.01)
(Continued)

(52) U.S. Cl.
CPC ............ *H04W 28/06* (2013.01); *H03M 7/3084* (2013.01); *H03M 7/6011* (2013.01); *H03M 7/6064* (2013.01); *H04L 69/04* (2013.01)
USPC .......................................... 370/329; 370/466

(58) Field of Classification Search
CPC ............ H04L 29/0604; H03M 7/6011; H03M 7/6064
USPC .......................................................... 370/329
See application file for complete search history.

(56) References Cited

U.S. PATENT DOCUMENTS

| 2002/0097723 | A1* | 7/2002 | Tourunen et al. | ............. 370/392 |
| 2005/0025188 | A1* | 2/2005 | Numakura et al. | ........... 370/490 |
| 2011/0292872 | A1* | 12/2011 | Hans et al. | .................... 370/328 |

FOREIGN PATENT DOCUMENTS

| CN | 1777175 | 5/2006 |
| CN | 1783876 | 6/2006 |

(Continued)

OTHER PUBLICATIONS

International Search Report of Corresponding PCT Application PCT/CN2010/080574 mailed Apr. 21, 2011.
(Continued)

*Primary Examiner* — Huy D Vu
*Assistant Examiner* — Kevin Cunningham
(74) *Attorney, Agent, or Firm* — Staas & Halsey LLP

(57) ABSTRACT

The present invention discloses a method and an apparatus for compressing and decompressing an IP data packet. The method includes: performing, by a first device, compression processing on IP data in an IP data packet according to a first compression algorithm; and encapsulating, by the first device, the IP data after the compression processing into a packet data convergence protocol (PDCP) data packet, where header information of the PDCP data packet includes identifier information, where the identifier information is used to indicate the first compression algorithm or indicate that the IP data is compressed.

15 Claims, 8 Drawing Sheets

(51) Int. Cl.
*H03M 7/30* (2006.01)
*H04L 29/06* (2006.01)

(56) References Cited

FOREIGN PATENT DOCUMENTS

CN 101316379 12/2008
CN 101325696 12/2008

OTHER PUBLICATIONS

Office Action, dated May 6, 2013, in corresponding Chinese Application No. 201010003376.X (12 pp.).

International Search Report issued Apr. 21, 2011 in corresponding International Patent Application No. PCT/CN2010/080574.

Written Opinion of the International Search Authority issued Apr. 21, 2011 in corresponding International Patent Application No. PCT/CN2010/080574.

Hang-hang Ma et al., "Research and Realization of IPComp Protocol in IPv6", Science Technology and Engineering, Jul. 2009, vol. 9, No. 14, pp. 4162-4166.

"3$^{rd}$ Generation Partnership Project; Technical Specification Group Radio Access Network; Packet Data Convergence Protocol (PDCP) specification (Release 8)", 3GPP TS 25.323 V8.4.2, Jul. 2009, pp. 1-41.

"3$^{rd}$ Generation Partnership Project; Technical Specification Group Radio Access Network; Radio Resource Control (RRC); Protocol Specification (Release 9)", 3GPP TS 25.331 V9.0.0, Sep. 2009, pp. Jan. 1671.

\* cited by examiner

METHOD AND APPARATUS FOR COMPRESSING AND DECOMPRESSING IP DATA PACKET

CROSS-REFERENCE TO RELATED APPLICATIONS

This application is a continuation of International Application No. PCT/CN2010/080574, filed on Dec. 31, 2010, which claims priority to Chinese Patent Application No. 201010003376.X, filed with the Chinese Patent Office on Jan. 18, 2010 and entitled "METHOD AND APPARATUS FOR COMPRESSING AND DECOMPRESSING IP DATA PACKET", which is incorporated herein by reference in its entirety.

FIELD OF THE INVENTION

The embodiments of the present invention relate to the field of communications technologies, and in particular, to a method and an apparatus for compressing and decompressing an IP data packet.

BACKGROUND OF THE INVENTION

During transmission of an IP data packet in a wireless communication field, the IP data packet is usually compressed to achieve a purpose of saving an air interface resource. In the prior art, a header compression manner is used as a compression manner for an IP data packet, that is, an IP header of the IP data packet is compressed. Header compression is mainly aimed at an IP data packet in which the data amount of an IP header is large but the data amount of IP data is small. Usually, IP headers of multiple such IP data packets do not change greatly and repetition is high. The IP header of the IP data packet is compressed by using a header compression method, which may achieve the purpose of saving an air interface resource.

In actual application, services such as Web browse and email services are widely used by wireless users. Header compression is not applicable to this part of data, but a burden of air interface transmission is increased if this part of data is transmitted on an air interface without being compressed.

SUMMARY OF THE INVENTION

Embodiments of the present invention provide a method and an apparatus for compressing and decompressing an IP data packet, so as to save an air interface resource in a transmission process.

An embodiment of the present invention provides a method for compressing an IP data packet, where the method includes:

performing, by a first device, compression processing on IP data in an IP data packet according to a first compression algorithm; and encapsulating, by the first device, the IP data after the compression processing into a packet data convergence protocol PDCP data packet, where header information of the PDCP data packet includes identifier information, and the identifier information is used to indicate the first compression algorithm or indicate that the IP data is compressed.

An embodiment of the present invention provides a method for decompressing an IP data packet, where the method includes:

receiving, by a first device, a packet data convergence protocol PDCP data packet sent by a second device, where header information of the PDCP data packet includes identifier information, and the identifier information is used to indicate a first compression algorithm;

obtaining, by the first device, the first compression algorithm according to the identifier information in the header information of the PDCP data packet; and performing, by the first device, decompression processing on IP data in the PDCP data packet according to the first compression algorithm.

An embodiment of the present invention provides an apparatus for compressing an IP data packet, where the apparatus includes:

a first compressing module, configured to perform compression processing on IP data in an IP data packet according to a first compression algorithm; and an encapsulating module, configured to encapsulate the IP data after the compression processing into a packet data convergence protocol PDCP data packet, where header information of the PDCP data packet includes identifier information, and the identifier information is used to indicate the first compression algorithm or indicate that the IP data is compressed.

An embodiment of the present invention provides an apparatus for decompressing an IP data packet, where the apparatus includes:

a third receiving module, configured to receive a PDCP data packet sent by a second device, where header information of the PDCP data packet includes identifier information, and the identifier information is used to indicate a first compression algorithm;

an obtaining module, configured to obtain the first compression algorithm according to the identifier information in the header information of the PDCP data packet; and a decompressing module, configured to perform decompression processing on IP data in the PDCP data packet according to the first compression algorithm.

In the technical solutions of the embodiments of the present invention, compression processing is performed on the IP data in the IP data packet according to the first compression algorithm, and the IP data after the compression processing is encapsulated into a PDCP data packet, so that compression of the IP data in the IP data packet is implemented. Therefore, an air interface resource is saved in a transmission process.

BRIEF DESCRIPTION OF THE DRAWINGS

To describe the technical solutions in the embodiments of the present invention or in the prior art more clearly, the accompanying drawings required for describing the embodiments or the prior art are briefly introduced in the following. Apparently, the accompanying drawings in the following description are some embodiments of the present invention, and persons of ordinary skill in the art may also derive other drawings according to these accompanying drawings without creative efforts.

DETAILED DESCRIPTION OF THE EMBODIMENTS

To make the objective, technical solutions, and advantages of the embodiments of the present invention clearer, the technical solutions in the embodiments of the present invention are described clearly and completely in the following with reference to the accompanying drawings in the embodiments of the present invention. Apparently, the embodiments to be described are only a part rather than all of the embodiments of the present invention. Based on the embodiments of the present invention, all other embodiments obtained by persons of ordinary skill in the art without creative efforts shall fall within the protection scope of the present invention.

Figure 1:
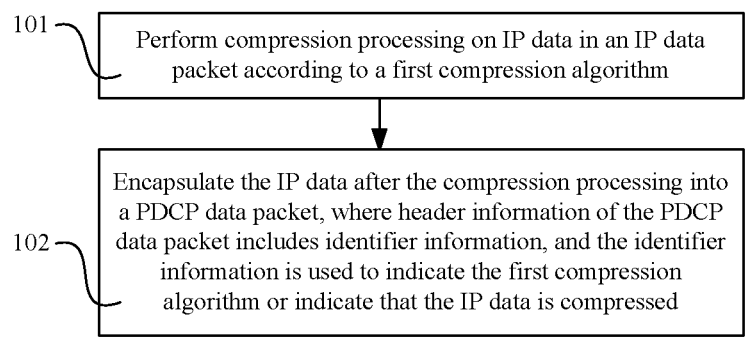
FIG. 1 is a flowchart of a method for compressing an IP data packet according to a first embodiment of the present invention.

FIG. 1 is a flowchart of a method for compressing an IP data packet according to a first embodiment of the present invention. As shown in FIG. 1, the method includes:

Step 101: Perform compression processing on IP data in an IP data packet according to a first compression algorithm.

In this embodiment, each step may be executed by a first device or a second device. The first device may be a terminal or a network device, and the second device may be a terminal or a network device. The terminal may include a user equipment (User Equipment, hereinafter referred to as UE) or a relay station. The network device may include a radio network controller (Radio Network Controller, hereinafter referred to as RNC), a gateway GPRS support node (Gateway GPRS Support Node, hereinafter referred to as GGSN), or a relay station. The foregoing terminal and network device are only used as several examples of the embodiments of the present invention, and should not be construed as limitations on the embodiments of the present invention. In actual application, the terminal and network device may adopt other devices according to a requirement.

In this embodiment, the IP data packet includes an IP header and IP data. In this step, compression processing may be performed on the IP data in the IP data packet, and compression processing may not be performed on the IP header.

Step 102: Encapsulate the IP data after the compression processing into a packet data convergence protocol (Packet Data Convergence Protocol, hereinafter referred to as PDCP) data packet, where header information of the PDCP data packet includes identifier information, and the identifier information is used to indicate the first compression algorithm or indicate that the IP data is compressed.

The identifier information may be used to identify a compression status of the IP data. Specifically, the identifier information may be used to indicate that the IP data is compressed or may be used to indicate the first compression algorithm. The header information may include a PDCP header and an IP header. Therefore, the identifier information may be set in the PDCP header or the IP header, or the identifier information may be set in the PDCP header and the IP header at the same time.

In this embodiment, the identifier information is written into the header information of the PDCP data packet, so that header information of a generated PDCP data packet includes the identifier information.

In the technical solution of this embodiment, compression processing may be performed on the IP data in the IP data packet according to the first compression algorithm, and the IP data after the compression processing is encapsulated into a PDCP data packet, so that compression of the IP data in the IP data packet is implemented. Therefore, an air interface resource is saved in a transmission process, a burden of air interface transmission is reduced, and network capacity is increased.

Figure 2:
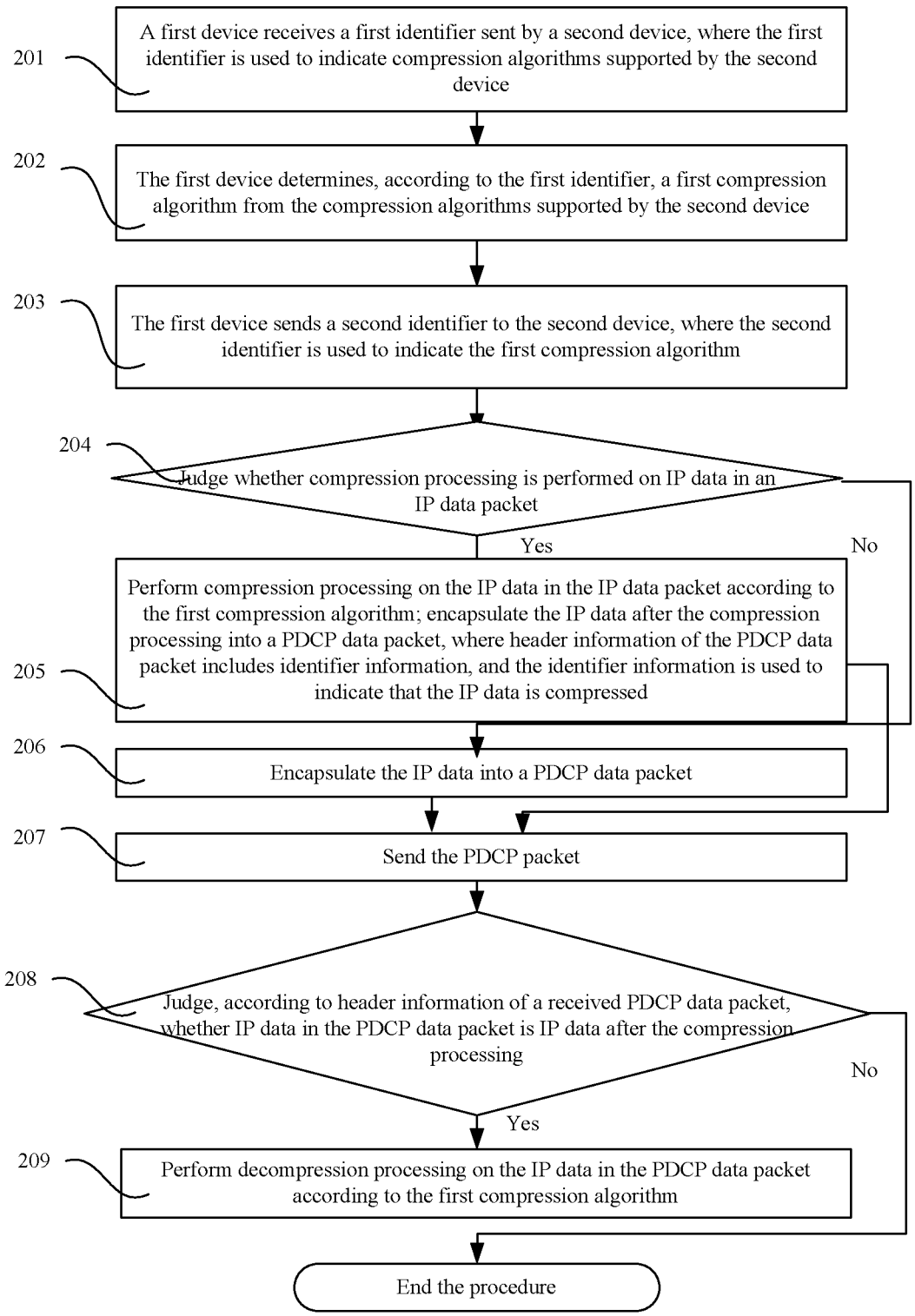
FIG. 2 is a flowchart of a method for compressing an IP data packet according to a second embodiment of the present invention.

FIG. 2 is a flowchart of a method for compressing an IP data packet according to a second embodiment of the present invention. As shown in FIG. 2, the method includes:

Step 201: A first device receives a first identifier sent by a second device, where the first identifier is used to indicate compression algorithms supported by the second device.

In each embodiment of the present invention, when the first device is a terminal, the second device may be a network device or a terminal; when the first device is a network device, the second device is a terminal or a network device, which are not repeated in subsequent embodiments.

In this embodiment, the compression algorithms supported by the second device may include one or any combination of the following: an LZW algorithm, an LZSS algorithm, and an LZO algorithm.

In the LZW algorithm, L represents Abraham Lempel, Z represents Jacob Ziv, and W represents Welch; in the LZSS algorithm, L represents Abraham Lempel, Z represents Jacob Ziv, W represents Welch, S represents James Storer, and S represents Thomas Szymanski; and in the LZO algorithm, L represents Abraham Lempel, Z represents Jacob Ziv, and O represents Markus Franz Xaver Johannes Oberhumer. L, Z, W, and O are initials of English names of algorithm inventors.

In this embodiment, the second device may directly send the first identifier to the first device, or the second device may send the first identifier to the first device through another network device.

In this embodiment, the second device may send the first identifier to the first device through a radio resource control (Radio Resource Control, hereinafter referred to as RRC) message. The RRC message may include a dedicated RRC message or a system message, where the dedicated RRC message may include an uplink dedicated RRC message or a downlink dedicated RRC message.

In this embodiment, when the first device is a network device and the second device is a terminal, the second device may send a first identifier to the first device through an uplink RRC message, for example, an uplink dedicated RRC message may include an INTER RAT HANDOVER INFO message (INTER RAT HANDOVER INFO), an RRC CONNEC- TION SETUP COMPLETE message (RRC CONNECTION SETUP COMPLETE), or a UE CAPABILITY INFORMATION message (UE CAPABILITY INFORMATION). Specifically, the second device sends an uplink dedicated RRC message to the first device, where the uplink dedicated RRC message includes a first identifier. In this embodiment, a compression algorithm information element may be added to "PDCP capability" in an information element "UE radio access capability" of the uplink dedicated RRC message, for example, the compression algorithm information element may be "IP data packet compression algorithm capability". In this case, the first identifier may be set in the compression algorithm information element "IP data packet compression algorithm capability", as shown in the following Table 1:

TABLE 1

| IP Data Packet Compression Algorithm Capability | Configuration Label |
| --- | --- |
| >LZSS | Optional present (Optional Present, hereinafter referred to as OP) |
| >LZO | OP |
| >LZW | OP |

OP indicates that the compression algorithm information element "IP data packet compression algorithm capability" is optional.

Alternatively, in this embodiment, "IP data packet compression algorithm capability" may be indicated in the format of a bitmap (bitmap). For example, the bitmap format may be xyz, where x may be an identifier of the LZSS algorithm, y may be an identifier of the LZO algorithm, and z may be an identifier of the LZW algorithm. If x, y, or z is set to 1, it indicates that the first identifier includes an identifier of a compression algorithm that is corresponding to x, y, or z; if x, y, or z is set to 0, it indicates that the first identifier does not include an identifier of a compression algorithm that is corresponding to x, y, or z. For example, when xyz is 001, it indicates that the first identifier includes the LZW algorithm; when xyz is 011, it indicates that the first identifier includes the LZO algorithm and the LZW algorithm; when xyz is 111, it indicates that the first identifier includes the LZSS algorithm, the LZO algorithm, and the LZW algorithm.

In this embodiment, when the first device is a terminal and the second device is a network device, the second device may send a first identifier to the first device through a system message. Specifically, the second device sends a system message to the first device, where the system message includes a first identifier. For example, the system message may be a system information block (System Information Block, hereinafter referred to as SIB) message.

Step 202: The first device determines, according to the first identifier, a first compression algorithm from the compression algorithms supported by the second device.

Specifically, the first device may obtain, according to the first identifier, the compression algorithms supported by the second device, and determine the first compression algorithm from the compression algorithms supported by the second device.

In this embodiment, the first device may determine, according to the first identifier and configuration information of the first compression algorithm, the first compression algorithm from the compression algorithms supported by the second device. When the first device is a network device, the configuration information of the first compression algorithm may be, for example, configured by the network device locally, or configured and delivered by a core network to the network device. When the first device is a terminal, the configuration information of the first compression algorithm may be, for example, configured by the terminal locally or sent by a network side to the terminal.

In this embodiment, the configuration information of the first compression algorithm may include one or any combination of the following: compression algorithms that can be processed by the first device, consumption of resources of the first device by compression algorithms, and priorities of compression algorithms.

When the configuration information of the first compression algorithm includes the compression algorithms that can be processed by the first device, the first device may obtain, according to the first identifier, the compression algorithms supported by the second device, and determine, according to the compression algorithms that can be processed by the first device, the first compression algorithm from the compression algorithms supported by the second device. For example, the compression algorithms supported by the second device include the LZW algorithm, the LZSS algorithm, and the LZO algorithm, and the compression algorithms that can be processed by the first device include the LZW algorithm. In this case, a determined first compression algorithm is the LZW algorithm.

When the configuration information of the first compression algorithm includes the consumption of resources of the first device by the compression algorithms, the first device may obtain, according to the first identifier, the compression algorithms supported by the second device, and determine, according to the consumption of resources of the first device by the compression algorithms, the first compression algorithm from the compression algorithms supported by the second device. When the first device is a network device, specifically, if a load of the first device is relatively high, a compression algorithm whose consumption of a resource of the first device is lowest may be determined from the compression algorithms supported by the second device as the first compression algorithm; or if a load of the first device is relatively low, a compression algorithm whose consumption of a resource of the first device is highest may be determined from the compression algorithms supported by the second device as the first compression algorithm. When the first device is a terminal, specifically, the first device may determine a compression algorithm whose consumption of a resource of the first device is lowest among the compression algorithms supported by the second device as the first compression algorithm.

When the configuration information of the first compression algorithm includes the compression algorithms that can be processed by the first device and the consumption of resources of the first device by the compression algorithms, the first device may obtain, according to the first identifier, the compression algorithms supported by the second device, and determine, according to the compression algorithms that can be processed by the first device and the consumption of resources of the first device by the compression algorithms, the first compression algorithm from the compression algorithms supported by the second device. Specifically, the first device may determine, according to the compression algorithms that can be processed by the first device, to-be-determined compression algorithms from the compression algorithms supported by the second device, and determine the first compression algorithm from the to-be-determined compression algorithms according to the consumption of resources of the first device by the compression algorithms. For example, the compression algorithms supported by the second device include the LZW algorithm, the LZSS algorithm, and the LZO algorithm, and the compression algorithms that can be processed by the first device include the LZO algorithm and the LZSS algorithm. In this case, the first device may determine the LZO algorithm and the LZSS algorithm from the LZW algorithm, the LZSS algorithm, and the LZO algorithm as to-be-determined compression algorithms according to the compression algorithms that can be processed by the first device, and determine the first compression algorithm from the LZO algorithm and the LZSS algorithm according to the consumption of resources of the first device by the compression algorithms.

When the configuration information of the first compression algorithm may include the compression algorithms that can be processed by the first device and the priorities of compression algorithms, the first device may obtain, according to the first identifier, the compression algorithms supported by the second device, and determine, according to the compression algorithms that can be processed by the first device and the priorities of compression algorithms, the first compression algorithm from the compression algorithms supported by the second device. Specifically, the first device may determine, according to the compression algorithms that can be processed by the first device, to-be-determined compression algorithms from the compression algorithms supported by the second device, and determine the first compression algorithm from the to-be-determined compression algorithms according to the priorities of compression algorithms. For example, the compression algorithms supported by the second device include the LZW algorithm, the LZSS algorithm, and the LZO algorithm, and the compression algorithms that can be processed by the first device include the LZO algorithm and the LZSS algorithm. In this case, the first device may determine the LZO algorithm and the LZSS algorithm from the LZW algorithm, the LZSS algorithm, and the LZO algorithm as to-be-determined compression algorithms according to the compression algorithms that can be processed by the first device. When a hardware compression manner is used, the priorities of compression algorithms may be, for example, the LZSS algorithm>the LZO algorithm>the LZW algorithm, and in this case, the first device may determine the LZSS algorithm with a highest priority from the to-be-determined compression algorithms as the first compression algorithm according to the priorities of compression algorithms. Alternatively, when a software compression algorithm is used, the priorities of compression algorithms may be, for example, the LZO algorithm>the LZW algorithm>the LZSS algorithm, and in this case, the first device may determine the LZO algorithm with a highest priority from the to-be-determined compression algorithms as the first compression algorithm according to the priorities of compression algorithms.

In this embodiment, cases where the configuration information of the first compression algorithm includes the consumption of resources of the first device by the compression algorithms, the priorities of compression algorithms, or any combination of the two is not further enumerated one by one.

Step 203: The first device sends a second identifier to the second device, where the second identifier is used to indicate the first compression algorithm.

In this embodiment, the first device may directly send the second identifier to the second device, or the first device may send the second identifier to the second device through another network device.

In this embodiment, when the first device is a network device and the second device is a terminal device, the first device may send a second identifier to the second device through a downlink dedicated RRC message, and the downlink dedicated RRC message, for example, may include a Radio Bearer Setup (Radio Bearer Setup) message or a Radio Bearer Reconfiguration (Radio Bearer Reconfiguration) message. Specifically, the first device sends a downlink dedicated RRC message to the second device, where the downlink dedicated RRC message includes a second identifier. In this embodiment, a compression algorithm information element may be added to an information element of the downlink dedicated RRC message, for example, the compression algorithm information element may be "IP data packet compression algorithm". In this case, the second identifier may be set in the compression algorithm information element "IP data packet compression algorithm". For example, when the downlink dedicated RRC message is a Radio Bearer Setup message, the information element of the downlink dedicated RRC message may include "PDCP info", where the "PDCP info" may be located in an information element "RB information to setup", where the "RB information to setup" may be located in "RAB information for setup"; when the downlink dedicated RRC message is a Radio Bearer Reconfiguration message, the information element of the downlink dedicated RRC message may include "PDCP info", where the "PDCP info" may be located in an information element "RB information to reconfigure", where the "RB information to reconfigure" may be located in the information element "RB information to reconfigure". An added compression algorithm information element may be as shown in the following Table 2:

TABLE 2

| IP data packet compression algorithm | OP | Enumerated (LZSS, LZO, LZW, spare) |

In this embodiment, when the first device is a terminal and the second device is a network device, for a first device in a non-connected state, a second identifier may be sent to the second device through an uplink dedicated RRC message, for example, the uplink dedicated RRC message may include an RRC CONNECTION REQUEST (RRC CONNECTION REQUEST) or an RRC CONNECTION SETUP COMPLETE (RRC CONNECTION SETUP COMPLETE) message. In this embodiment, the second identifier may be set in an information element of the uplink dedicated RRC message. Specifically, for the information element of the uplink dedicated RRC message, reference may be made to the description about the information element of the uplink dedicated RRC message in step 201. For a first device in a connected state, an identifier of a specified compression algorithm may be sent to the second device through an uplink dedicated RRC message, where the uplink dedicated RRC message includes a second identifier. When the second device finds that the second device itself cannot use a first compression algorithm indicated by a second identifier, where the second identifier is determined by the first device, the second device may send a second identifier determined by the second device to the first device through a downlink dedicated RRC message.

Step 204: Judge whether compression processing is performed on IP data in an IP data packet; if compression processing is performed on IP data in an IP data packet, execute step 205, and if compression processing is not performed on IP data in an IP data packet, execute step 206.

This step may be executed by the first device or the second device.

In this embodiment, a first compression algorithm may be obtained according to a received second identifier.

In this embodiment, it may be judged, according to a compression rate of the first compression algorithm, whether compression processing is performed on the IP data in the IP data packet. When the compression rate of the first compression algorithm satisfies a compression rate that needs to be used currently, it is judged that compression processing is performed on the IP data in the IP data packet; when the compression rate of the first compression algorithm does not satisfy a compression rate that needs to be used currently, it is judged that compression processing is not performed on the IP data in the IP data packet. For example, when the compression rate of the first compression algorithm is relatively high, while the compression rate that needs to be used currently is relatively low, it is judged that compression processing is not performed on the IP data in the IP data packet.

Alternatively, in this embodiment, it may also be judged, according to a service type of IP data, whether compression processing is performed on the IP data in the IP data packet. When the service type of the IP data satisfies a type of a service that needs to be compressed currently, it is judged that compression processing is performed on the IP data in the IP data packet; when the service type of the IP data does not satisfy a type of a service that needs to be compressed currently, it is judged that compression processing is not performed on the IP data in the IP data packet. For example, when the service type of the IP data is video data, while the type of the service that needs to be compressed currently is text data, it is judged that compression processing is not performed on the IP data in the IP data packet.

Step 205: Perform compression processing on the IP data in the IP data packet according to the first compression algorithm; encapsulate the IP data after the compression processing into a PDCP data packet, where header information of the PDCP data packet includes identifier information, and the identifier information is used to indicate that the IP data is compressed; and execute step 207.

When step 204 is executed by the first device, this step is executed by the first device; when step 204 is executed by the second device, this step is executed by the second device.

When this step is executed by the second device, the second device may obtain a first compression algorithm according to a second identifier received in step 203.

In this embodiment, the PDCP data packet includes header information and the IP data after the compression processing, where the header information includes a PDCP header and an IP header of the IP data packet; in this case, the identifier information may be set in the PDCP header or set in the IP header.

When the identifier information is set in the PDCP header, the identifier information may be a compression identifier (Compression Identifier, hereinafter referred to as CID), where the CID may be set to 0 or 1. When CID=0, it indicates that the PDCP data packet is not compressed, and a receiver does not need to perform a decompression operation; when CID=1, it indicates that the PDCP data packet is compressed, and a receiver needs to perform a decompression operation. In this step, the CID is set to 1.

For example, the CID may be set in a reserved bit of a packet identifier (Packet Identifier, hereinafter referred to as PID) of a PDCP header of a PDCP protocol data unit (Protocol Data Unit, hereinafter referred to as PDU) that makes up the PDCP data packet, as shown in Table 3.

| PID Value | Optimisation method | Packet type |
|---|---|---|
| 0 | No header compression | — |
| 1 | RFC 2507 | Full header |
| 2 | RFC 2507 | Compressed TCP |
| 3 | RFC 2507 | Compressed TCP nondelta |
| 4 | RFC 2507 | Compressed non TCP |
| 5 | RFC 2507 | Context state |
| 6 | Method A | Packet Type 1 of Method A |
| 7 | Method A | Packet Type 2 of Method A |
| 8 | Method B | Packet Type 1 of Method B |
| 9 | Method B | Packet Type 2 of Method B |
| 10 | RFC 3095 | RFC 3095 packet format |
| 11 | Method C | Packet Type 1 of Method C |
| 12 | Method C | Packet Type 2 of Method C |
| 13 . . . 31 | Reserved bits | — |

As shown in Table 3, the CID may be written into reserved bits 13 to 31 of "PID Value" of a PID.

For example, the CID may also be set in an extended bit of a PID. An existing PID may be extended. An extended bit is added after an existing 32-bit PID, and the CID is written into the extended bit.

When the identifier information is set in the IP header, the identifier information may be a CID, where the CID may be set to a value that is not used currently and the CID indicates that the PDCP data packet is compressed, and a receiver needs to perform a decompression operation; at this time, when the IP header does not include the CID, it indicates that the PDCP data packet is not compressed, and the receiver does not need to perform a decompression operation. The IP data may include IPv4 data, IPv6 data, and/or point to point protocol (Point to Point Protocol, hereinafter referred to as PPP), where: an IP header of the IPv4 data is 0x4X, an IP header of the IPv6 data is 0x6X, and an IP header of the PPP data is 0x7E. Therefore, the CID may be set to a value 0x00 that is not used currently, and in this case, CID=0x00. The CID is written into a specific field of the IP header, for example, the specific field may be a first 8 bits of the IP header, and in this case, a structure of the PDCP data packet in which the IP header includes the CID may be shown as follows:

PDCP header |IP header [CID(0x00)|0x4X/0x6X/0x7E] |IP data (IPv4 data/IPv6 data/PPP data)

Step 206: Encapsulate the IP data into a PDCP data packet, and execute step 207.

When step 204 is executed by the first device, this step is executed by the first device; when step 204 is executed by the second device, this step is executed by the second device.

When the identifier information is set in a PDCP header, the identifier information may be a CID. Header information of the PDCP data packet includes a CID, where the CID may be specifically set in a PID of a PDCP header of a PDCP PDU that makes up the PDCP data packet, and the CID=0.

When the identifier information is set in an IP header, the identifier information may be a CID, and the PDCP data packet does not include the CID. In this case, a structure of the PDCP data packet in which the IP header does not include the CID may be shown as follows:

PDCP header |IP header (0x4X/0x6X/0x7E)|IP data (IPv4 data/IPv6 data/PPP data)

Step 207: Send the PDCP data packet.

When step 204 is executed by the first device, this step is specifically: The first device sends the PDCP data packet to the second device; when step 204 is executed by the second device, this step is specifically: The second device sends the PDCP data packet to the first device.

Step 208: Judge, according to header information of a received PDCP data packet, whether IP data in the PDCP data packet is IP data after the compression processing; if the IP data in the PDCP data packet is IP data after the compression processing, execute step 209, and if the IP data in the PDCP data packet is not IP data after the compression processing, end the procedure.

When step 207 is executed by the first device, this step is executed by the second device; when step 207 is executed by the second device, this step is executed by the first device.

When the identifier information is set in the PDCP header of the header information, it may be judged, according to the identifier information, whether the IP data in the PDCP data packet is IP data after the compression processing, for example, when CID=1, it is judged that the IP data is IP data after the compression processing; when CID=0, it is judged that the IP data is not IP data after the compression processing.

When the identifier information is set in the IP header of the header information, it may be judged, according to whether the IP header includes identifier information, whether the IP data in the PDCP data packet is IP data after the compression processing, for example, when the IP header includes identifier information, it is judged that the IP data is IP data after the compression processing; when the IP header does not include identifier information, it is judged that the IP data is not IP data after the compression processing.

Step 209: Perform decompression processing on the IP data in the PDCP data packet according to the first compression algorithm, and end the procedure.

An execution sequence of steps in this embodiment is only exemplary, and may be changed according to a requirement in actual application. For example, when step 205 is executed by the first device, step 203 may be executed after step 205.

In this embodiment, the first device determines the first compression algorithm from the compression algorithms supported by the second device, and sends the second identifier that indicates the first compression algorithm to the second device; the first device or the second device may perform compression processing on the IP data in the IP data packet according to the first compression algorithm, and encapsulate the IP data after the compression processing into a PDCP data packet and send the PDCP data packet, so that compression of the IP data in the IP data packet is implemented. Therefore, an air interface resource is saved in a transmission process, a burden of air interface transmission is reduced, and network capacity is increased. In this embodiment, the first device determines the first compression algorithm and sends the identifier that indicates the first compression algorithm to the second device, so that the second device may perform compression processing on the IP data according to the first compression algorithm, and the second device does not need to execute a process of determining the first compression algorithm, thereby avoiding consumption of a resource of the second device.

Figure 3:
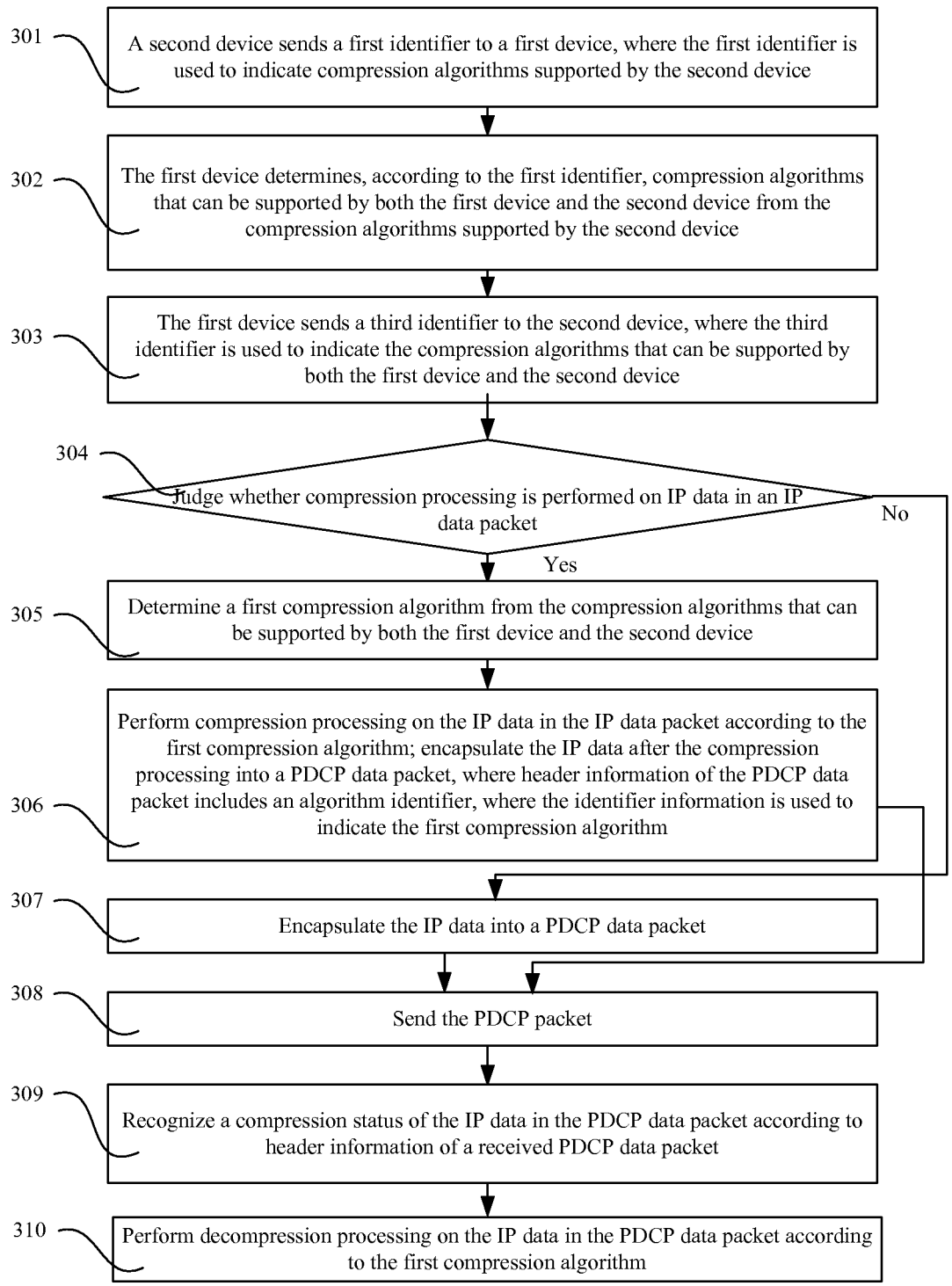
FIG. 3 is a flowchart of a method for compressing an IP data packet according to a third embodiment of the present invention.

FIG. 3 is a flowchart of a method for compressing an IP data packet according to a third embodiment of the present invention. As shown in FIG. 3, the method includes:

Step 301: A second device sends a first identifier to a first device, where the first identifier is used to indicate compression algorithms supported by the second device.

For the description of step 301, reference may be made to step 201 in the second embodiment, which is not repeated here.

Step 302: The first device determines, according to the first identifier, compression algorithms that can be supported by both the first device and the second device from the compression algorithms supported by the second device.

Specifically, the first device may obtain, according to the first identifier, the compression algorithms supported by the second device, and determine the compression algorithms that can be supported by both the first device and the second device from the compression algorithms supported by the second device.

In this embodiment, the first device may determine, according to the first identifier and configuration information of a second compression algorithm, compression algorithms that can be supported by both the first device and the second device from the compression algorithms supported by the second device. When the first device is a network device, the configuration information of the second compression algorithm may be, for example, configured by the network device locally, or configured and delivered by a core network to the network device. When the first device is a terminal, the configuration information of the second compression algorithm may be, for example, configured by the terminal locally or sent by a network side to the terminal.

In this embodiment, the configuration information of the second compression algorithm may include compression algorithms that can be processed by the first device. Specifically, the first device may obtain, according to the first identifier, the compression algorithms supported by the second device, and determine, according to the compression algorithms that can be processed by the first device, the compression algorithms that can be supported by both the first device and the second device from the compression algorithms supported by the second device. For example, the compression algorithms supported by the second device include a compression algorithm 1, a compression algorithm 2, a compression algorithm 3, and a compression algorithm 4, while the compression algorithms that can be processed by the first device include the compression algorithm 2, the compression algorithm 3, and the compression algorithm 4. In this case, the compression algorithms that are supported by both the first device and the second device, and are determined by the first device include the compression algorithm 2, the compression algorithm 3, and the compression algorithm 4.

Alternatively, in this embodiment, the configuration information of the second compression algorithm may include compression algorithms that can be processed by the first device and consumption of resources of the first device by compression algorithms. In this case, the first device may obtain, according to the first identifier, the compression algorithms supported by the second device, and determine, according to the compression algorithms that can be processed by the first device and the consumption of resources of the first device by the compression algorithms, compression algorithms that can be supported by both the first device and the second device from the compression algorithms supported by the second device. Specifically, the first device may obtain, according to the first identifier, the compression algorithms supported by the second device, determine, according to the compression algorithms that can be processed by the first device, to-be-determined compression algorithms from the compression algorithms supported by the second device, and determine, according to the consumption of resources of the first device by the compression algorithms, compression algorithms that can be supported by both the first device and the second device from the to-be-determined compression algorithms. When the first device is a network device, for example, if a load of the first device is relatively high, compression algorithms whose consumption of resources of the first device is relatively low may be determined from the to-be-determined compression algorithms as compression algorithms that can be supported by both the first device and the second device; if a load of the first device is relatively low, compression algorithms whose consumption of resources of the first device is relatively high may be determined from the to-be-determined compression algorithms as compression algorithms that can be supported by both the first device and the second device. When the first device is a terminal, specifically, the first device may determine compression algorithms whose consumption of resources of the first device is lowest among the to-be-determined compression algorithms as compression algorithms that can be supported by both the first device and the second device. For example, the compression algorithms supported by the second device include the compression algorithm 1, the compression algorithm 2, the compression algorithm 3, and the compression algorithm 4, while the compression algorithms that can be processed by the first device include the compression algorithm 2, the compression algorithm 3, and the compression algorithm 4. In this case, the to-be-determined compression algorithms determined by the first device include the compression algorithm 2, the compression algorithm 3, and the compression algorithm 4; and the compression algorithm 3 and the compression algorithm 4 are determined, according to the consumption of resources of the first device by the compression algorithms, as compression algorithms that can be supported by both the first device and the second device.

Step 303: The first device sends a third identifier to the second device, where the third identifier is used to indicate the compression algorithms that can be supported by both the first device and the second device.

In this embodiment, the first device may directly send the third identifier to the second device, or the first device may send the third identifier to the second device through another network device.

In this embodiment, when the first device is a network device and the second device is a terminal device, the first device may send a third identifier to the second device through a downlink dedicated RRC message or a system message. Specifically, the first device sends a downlink dedicated RRC message or a system message to the second device, where the downlink dedicated RRC message or the system message includes a third identifier. In this embodiment, a compression algorithm information element may be added to the downlink dedicated RRC message or the system message; in this case, the third identifier may be set in an added compression algorithm information element, for example, the compression algorithm information element may be "IP data packet compression algorithm capability", and details are as shown in Table 1 in the second embodiment. Alternatively, in this embodiment, "IP data packet compression algorithm capability" may be indicated in the format of a bitmap (bitmap). For a specific description, reference may be made to the second embodiment.

Step 304: Judge whether compression processing is performed on IP data in an IP data packet; if compression processing is performed on IP data in an IP data packet, execute step 305, and if compression processing is not performed on IP data in an IP data packet, execute step 307.

For the description of step 304, reference may be made to step 204 in the second embodiment, which is not repeated here.

Step 305: Determine a first compression algorithm from the compression algorithms that can be supported by both the first device and the second device.

When step 304 is executed by the first device, this step is executed by the first device. The first device determines the first compression algorithm from the compression algorithms that can be supported by both the first device and the second device. For a specific process, reference may be made to the description of step 202 that the first device determines the first compression algorithm from the compression algorithms supported by the second device in the second embodiment.

When step 304 is executed by the second device, this step is executed by the second device. The second device determines, according to the third identifier, the first compression algorithm from the compression algorithms that can be supported by both the first device and the second device. For a specific process, reference may be made to the description of step 202 that the first device determines, according to the first identifier, the first compression algorithm from the compression algorithms supported by the second device in the second embodiment.

Step 306: Perform compression processing on the IP data in the IP data packet according to the first compression algorithm; encapsulate the IP data after the compression processing into a PDCP data packet, where header information of the PDCP data packet includes algorithm information, where the identifier information is used to indicate the first compression algorithm; and execute step 308.

When step 304 is executed by the first device, this step is executed by the first device; when step 304 is executed by the second device, this step is executed by the second device.

In this embodiment, the PDCP data packet includes header information and the IP data after the compression processing, where the header information includes a PDCP header and an IP header of the IP data packet; in this case, the identifier information may be set in the PDCP header or set in the IP header.

When algorithm information is set in the PDCP header, the identifier information may be a compression algorithm identifier (Compression Algorithm Identifier, hereinafter referred to as CAID), where the CAID, for example, may be set to 00, 01, 10, or 11. When CAID=00, it indicates that the PDCP data packet is not compressed, and a receiver does not need to perform a decompression operation; when CAID=01, it indicates that the PDCP data packet uses an LZSS algorithm, and the receiver needs to use the LZSS algorithm to perform a decompression operation; when CAID=10, it indicates that the PDCP data packet uses an LZW algorithm, and the receiver needs to use the LZW algorithm to perform a decompression operation; when CAID=11, it indicates that the PDCP data packet uses an LZO algorithm, and the receiver needs to use the LZO algorithm to perform a decompression operation. For example, when the first compression algorithm is the LZSS algorithm, the CAID is set to 01.

The CAID may be set in a reserved bit of a PID of a PDCP header of a PDCP PDU that makes up the PDCP data packet. As shown in Table 3, the CAID may be written into reserved bits 13 to 31 of "PID Value" of a PID.

For example, the CAID may also be set in an extended bit of the PID. An existing PID may be extended. An extended bit is added after an existing 32-bit PID, and the CAID is written into the extended bit.

When the identifier information is set in the IP header, the identifier information may be a CAID, where the CAID may be set to a value that is not used currently and the CAID indicates that the PDCP data packet is compressed, and a receiver needs to perform a decompression operation; at this time, when the IP header does not include the CAID, it indicates that the PDCP data packet is not compressed, and the receiver does not need to perform a decompression operation. The IP data may include IPv4 data, IPv6 data, and/or PPP data, where: an IP header of the IPv4 data is 0x4X, an IP header of the IPv6 data is 0x6X, and an IP header of the PPP data is 0x7E. Therefore, the CAID may be set to a value 0x00, 0x01, or 0x02 that is not used currently. The CAID is written into a specific field of the IP header, for example, the specific field may be a first 8 bits of the IP header, and in this case, a structure of the PDCP data packet in which the IP header includes the CAID may be shown as follows:

PDCP header |IP header [CAID(0x00/0x01/0x02)|0x4X/0x6X/0x7E]|IP data (IPv4 data/IPv6 data/PPP data)

When CAID=0x00, it indicates that the PDCP data packet uses an LZSS algorithm, and a receiver needs to use the LZSS algorithm to perform a decompression operation; when CAID=0x01, it indicates that the PDCP data packet uses an LZW algorithm, and the receiver needs to use the LZW algorithm to perform a decompression operation; when CAID=0x02, it indicates that the PDCP data packet uses an LZO algorithm, and the receiver needs to use the LZO algorithm to perform a decompression operation. For example, when the first compression algorithm is the LZSS algorithm, the CAID is set to 0x00.

Step 307: Encapsulate the IP data into a PDCP data packet, and execute step 308.

When step 304 is executed by the first device, this step is executed by the first device; when step 304 is executed by the second device, this step is executed by the second device.

Step 308: Send the PDCP data packet.

When step 304 is executed by the first device, this step is specifically: The first device sends the PDCP data packet to the second device; when step 304 is executed by the second device, this step is specifically: The second device sends the PDCP data packet to the first device.

Step 309: Recognize a compression status of the IP data in the PDCP data packet according to header information of a received PDCP data packet.

When step 308 is executed by the first device, this step is executed by the first device; when step 308 is executed by the second device, this step is executed by the second device.

The compression status of the IP data includes whether the IP data is IP data after the compression processing, and a first compression algorithm used when the IP data is IP data after the compression processing.

When the identifier information is set in the PDCP header of the header information, whether the IP data in the PDCP data packet is IP data after the compression processing may be recognized according to the identifier information, and the first compression algorithm that is used when the IP data is IP data after the compression processing may be recognized, for example, when CAID=01, it is recognized that the IP data is IP data after the compression processing and the used first compression algorithm is an LZSS algorithm.

When the identifier information is set in the IP header of the header information, whether the IP data in the PDCP data packet is IP data after the compression processing may be recognized according to whether the IP header includes the identifier information, and the first compression algorithm that is used when the identifier information is included may be recognized, for example, when CAID=0x00, it is recognized that the IP data is IP data after the compression processing and the first compression algorithm is an LZSS algorithm.

When the IP data is recognized as IP data after the compression processing and the used first compression algorithm is recognized, the following step is further included:

Step 310: Perform decompression processing on the IP data in the PDCP data packet according to the first compression algorithm.

An execution sequence of steps in this embodiment is only exemplary, and may be changed according to a requirement in actual application. For example, when step 305 is executed by the first device, step 303 may be executed after step 305.

In this embodiment, the first device determines the compression algorithms that can be supported by both the first device and the second device from the compression algorithms supported by the second device, and sends the third identifier that indicates the compression algorithms that can be supported by both the first device and the second device to the second device; the first device or the second device may determine the first compression algorithm from the compression algorithms that can be supported by both the first device and the second device, perform compression processing on the IP data in the IP data packet according to the first compression algorithm, and encapsulate the IP data after the compression processing into a PDCP data packet and send the PDCP data packet, so that compression of the IP data in the IP data packet is implemented. Therefore, an air interface resource is saved in a transmission process, a burden of air interface transmission is reduced, and network capacity is increased. In this embodiment, the first device determines the compression algorithms that can be supported by both the first device and the second device from the compression algorithms supported by the second device, and sends the third identifier that indicates the compression algorithms that can be supported by both the first device and the second device, so that the second device obtains the compression algorithms that can be supported by both the first device and the second device. When the first device or the second device needs to compress the IP data, the first compression algorithm may be determined from the compression algorithms that can be supported by both the first device and the second device, so that a first compression algorithm may be selected every time when IP data is compressed.

Figure 4:
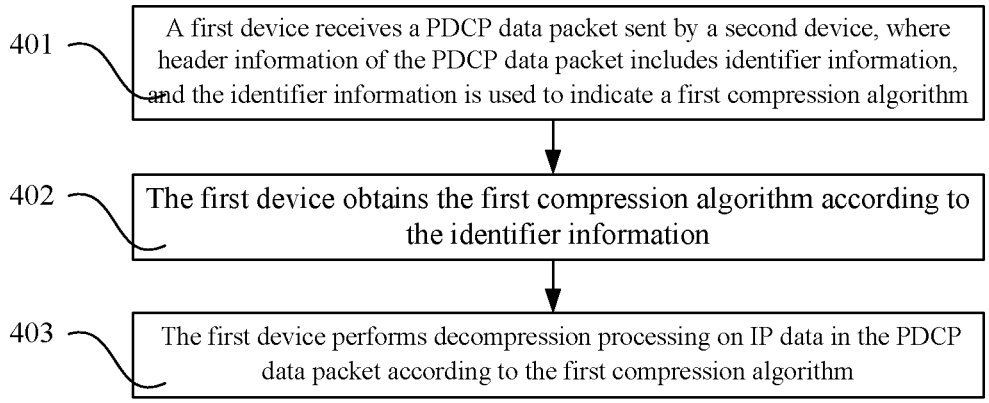
FIG. 4 is a flowchart of a method for decompressing an IP data packet according to a fourth embodiment of the present invention.

FIG. 4 is a flowchart of a method for decompressing an IP data packet according to a fourth embodiment of the present invention. As shown in FIG. 4, the method includes:

Step 401: A first device receives a PDCP data packet sent by a second device, where header information of the PDCP data packet includes identifier information, and the identifier information is used to indicate a first compression algorithm.

Step 402: The first device obtains the first compression algorithm according to the identifier information.

Step 403: The first device performs decompression processing on IP data in the PDCP data packet according to the first compression algorithm.

In the technical solution of this embodiment, the first device obtains, according to the header information of the received PDCP data packet, the first compression algorithm, and performs decompression processing on the IP data in the PDCP data packet according to the first compression algorithm. Because the IP data in the PDCP data packet is IP data on which compression processing is performed according to the first compression algorithm, an air interface resource is saved in a transmission process, a burden of air interface transmission is reduced, and network capacity is increased.

Figure 5:
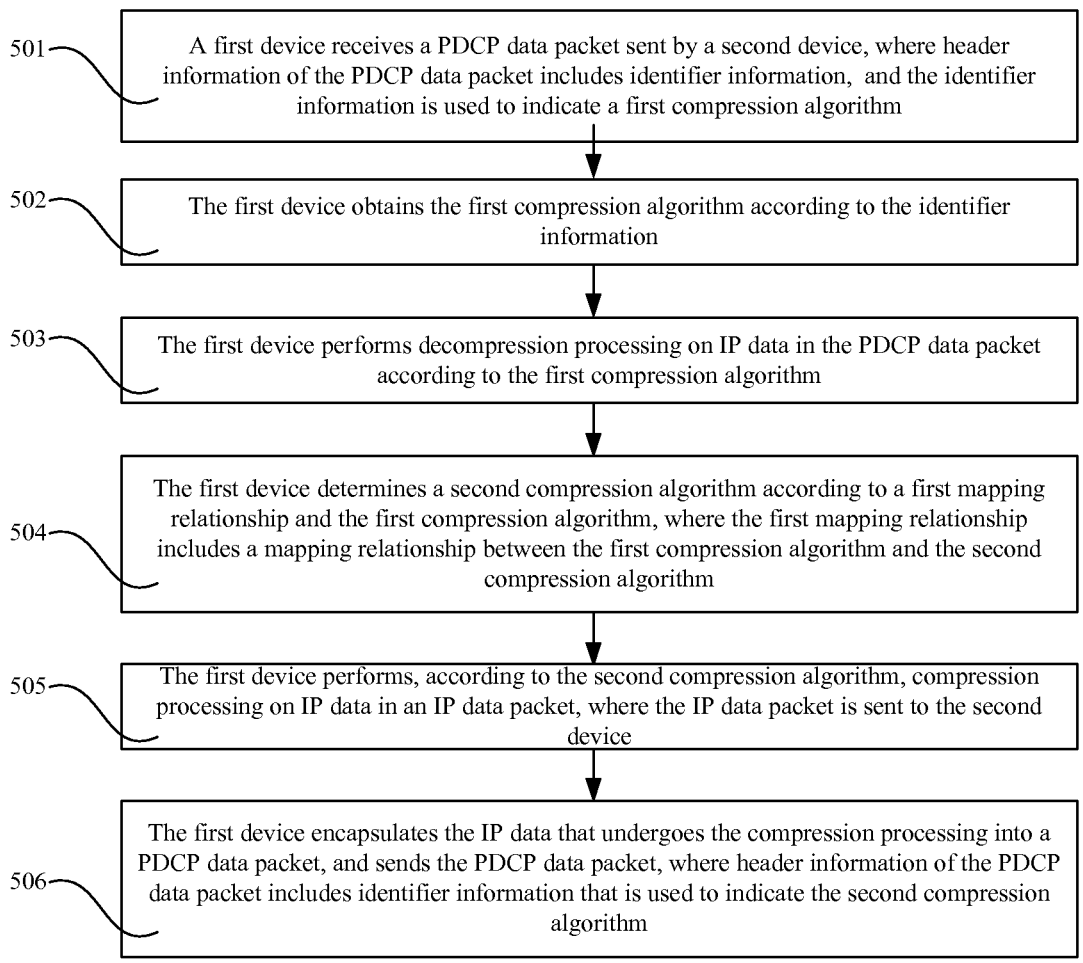
FIG. 5 is a flowchart of a method for decompressing an IP data packet according to a fifth embodiment of the present invention.

FIG. 5 is a flowchart of a method for decompressing an IP data packet according to a fifth embodiment of the present invention. As shown in FIG. 5, the method includes:

For step 501 to step 503, reference may be made to step 401 to step 403 in the fourth embodiment, which are not repeated here.

Step 504: A first device determines a second compression algorithm according to a first mapping relationship and a first compression algorithm, where the first mapping relationship includes a mapping relationship between the first compression algorithm and the second compression algorithm.

Specifically, the first device may query and find, according to the first mapping relationship, the second compression algorithm that is corresponding to the first compression algorithm.

Step 505: The first device performs, according to the second compression algorithm, compression processing on IP data in an IP data packet, where the IP data packet is sent to the second device.

Step 506: The first device encapsulates the IP data that undergoes the compression processing into a PDCP data packet, and sends the PDCP data packet, where header information of the PDCP data packet includes identifier information that is used to indicate the second compression algorithm.

In this embodiment, after obtaining the first compression algorithm, the first device may query and find, according to the mapping relationship between the first compression algorithm and the second compression algorithm, the second compression algorithm that is corresponding to the first compression algorithm, perform compression processing on the IP data in the IP data packet according to a second specified compression algorithm, encapsulate the IP data after the compression processing into a PDCP data packet, and send the PDCP data packet, so that compression of the IP data in the IP data packet is implemented. Therefore, an air interface resource is saved in a transmission process, a burden of air interface transmission is reduced, and network capacity is increased. In this embodiment, the first device may obtain the second compression algorithm by querying the mapping relationship between the first compression algorithm and the second compression algorithm without executing a process of determining the second compression algorithm, thereby avoiding consumption of a resource of the first device.

Further, in the fifth embodiment, if the second device does not send a PDCP data packet to the first device or the second device sends an empty data packet to the first device, the first device itself may determine a second compression algorithm. The first device may continue executing step 506 after determining the second compression algorithm. Alternatively, if the second device does not send a PDCP data packet to the first device, the first device may not perform compression processing on the IP data in the IP data packet, but directly encapsulates the IP data in the IP data packet into a PDCP data packet.

Figure 6:
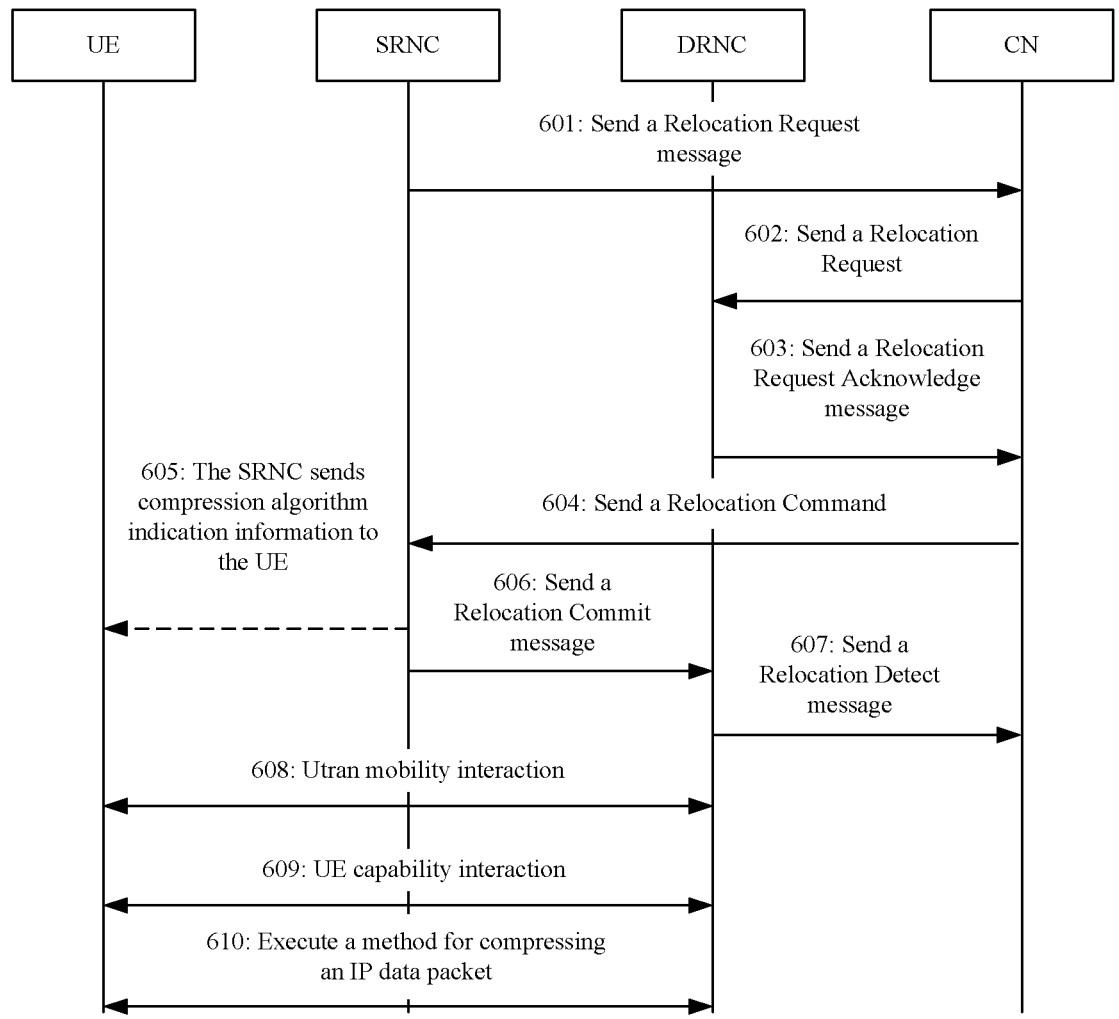
FIG. 6 is a flowchart of a handover method according to a sixth embodiment of the present invention.

In a process that a UE is handed over from a source cell to a target cell, when an inter-system handover or RNC migration occurs, with a handover method in the prior art, continuity of compressing an IP data packet cannot be ensured. To solve this problem, a sixth embodiment of the present invention provides a handover method. The sixth embodiment is described by taking RNC migration as an example. In this embodiment, a first device is a network device of a target cell, and a second device is a terminal. Specifically, the network device of the target cell is a drift RNC (Drift RNC, hereinafter referred to as DRNC), and the terminal may be a UE. FIG. 6 is a flowchart of a handover method according to the sixth embodiment of the present invention. As shown in FIG. 6, the method includes:

Step 601: A serving RNC (Serving RNC, hereinafter referred to as SRNC) sends a Relocation Required (Relocation Required) message to a core network (Core Network, hereinafter referred to as CN).

A Relocation Request message includes a fourth identifier and/or a first identifier. The SRNC sends the fourth identifier and/or the first identifier to the CN through the Relocation Request message. The fourth identifier is used to indicate a third compression algorithm, and the first identifier is used to indicate compression algorithms supported by the terminal. Because the terminal in this embodiment is a UE, the first identifier may be used to indicate compression algorithms supported by the UE. In this embodiment, the first identifier may be sent by the UE to the SRNC. The third compression algorithm is a compression algorithm that is used by the UE in a source cell. For example, the fourth identifier or the first identifier may be set in an information element "Source To Target Transparent Container" of the Relocation Request message.

Step 602: The CN sends a Relocation Request (Relocation Request) to the DRNC.

The Relocation Request includes a fourth identifier and/or a first identifier. The CN sends the fourth identifier and/or the first identifier to the DRNC through the Relocation Request. For example, the fourth identifier and/or the first identifier is set in an information element "Source RNC To Target RNC Transparent Container" of the Relocation Request.

Step 603: The DRNC sends a Relocation Request Acknowledge (Relocation Request Acknowledge) message to the CN.

When the Relocation Request includes the fourth identifier, if the DRNC supports the third compression algorithm that is indicated by the fourth identifier, the Relocation Request Acknowledge message may include compression algorithm indication information, where the compression algorithm indication information includes information indicating that the DRNC supports the third compression algorithm. For example, the compression algorithm indication information is set in an information element "Target RNC To Source RNC Transparent Container" of the Relocation Request Acknowledge message. If the DRNC does not support the third compression algorithm that is indicated by the fourth identifier, the Relocation Request Acknowledge message may not include any indication information.

When the Relocation Request includes compression algorithms that are supported by the UE and indicated by the first identifier, the Relocation Request Acknowledge message may include compression algorithm indication information, where the compression algorithm indication information includes information indicating that the DRNC supports the compression algorithms supported by the UE. When the DRNC supports the compression algorithms that are supported by the UE and indicated by the first identifier, the DRNC may further determine a first compression algorithm from the compression algorithms supported by the UE. In this case, the compression algorithm indication information in the Relocation Request Acknowledge message may include a second identifier, where the second identifier is used to identify the first compression algorithm. For example, the compression algorithm indication information is set in the information element "Target RNC To Source RNC Transparent Container" of the Relocation Request Acknowledge message.

When the Relocation Request includes the fourth identifier and the first identifier, if the DRNC supports the third compression algorithm that is indicated by the fourth identifier, the Relocation Request Acknowledge message may include compression algorithm indication information, where the compression algorithm indication information includes information indicating that the DRNC supports the third compression algorithm. For example, the compression algorithm indication information is set in the information element "Target RNC To Source RNC Transparent Container" of the Relocation Request Acknowledge message; if the DRNC does not support the third compression algorithm that is indicated by the fourth identifier but supports the compression algorithms that are supported by the UE and indicated by the first identifier, the Relocation Request Acknowledge message may include compression algorithm indication information, where the compression algorithm indication information includes information indicating that the DRNC supports the compression algorithms supported by the UE. When the DRNC supports the compression algorithms that are supported by the UE and identified by the first identifier, the DRNC may further determine a first compression algorithm from the compression algorithms supported by the UE. In this case, the compression algorithm indication information in the Relocation Request Acknowledge message may include a second identifier, where the second identifier is used to indicate the first compression algorithm. For example, the compression algorithm indication information is set in the information element "Target RNC To Source RNC Transparent Container" of the Relocation Request Acknowledge message. If the DRNC does not support the third compression algorithm that is indicated by the fourth identifier and the compression algorithms that are supported by the UE and indicated by the first identifier, the Relocation Request Acknowledge message may not include any indication information.

Step 604: The CN sends a Relocation Command (Relocation Command) to the SRNC.

If the Relocation Request Acknowledge message includes compression algorithm indication information, the Relocation Command includes the compression algorithm indication information; if the Relocation Request Acknowledge message does not include compression algorithm indication information, the Relocation Command does not include the compression algorithm indication information.

If a Relocation Command received by the SRNC does not include any indication information, the SRNC stops performing compression processing on IP data in an IP data packet in the source cell. After a handover is completed, the DRNC and the UE may re-determine a compression algorithm.

If the Relocation Command includes compression algorithm indication information, step 605 is executed, and otherwise, step 606 is executed directly.

Step 605: The SRNC sends the compression algorithm indication information to the UE.

Specifically, the SRNC may send the compression algorithm indication information to the UE through a downlink RRC message or a downlink PDCP data packet. For example, the compression algorithm indication information may be set in a PDCP header of the PDCP data packet. The UE may obtain a new specified compression algorithm according to the compression algorithm indication information.

Step 606: The SRNC sends a Relocation Commit (Relocation Commit) message to the DRNC.

Step 607: The DRNC sends a Relocation Detect (Relocation Detect) message to the CN.

Step 608: The UE performs universal terrestrial radio access (Universal Terrestrial Radio Access, hereinafter referred to as UTRAN) mobility interaction (UTRAN Mobility Interaction) with the DRNC.

Step 609: The UE performs UE capability interaction (UE Capability Interaction) with the DRNC.

Therefore, a handover process is completed.

Step 610: The UE and the DRNC execute a method for compressing an IP data packet.

Specifically, for step 610, reference may be made to the method in the first, second, or third embodiment. If the compression algorithm indication information sent by the SRNC to the UE in step 605 includes the second identifier that is used to indicate the first compression algorithm, when the UE and the DRNC execute the method for compressing an IP data packet, the UE or the DRNC may perform compression processing on IP data in the IP data packet according to the first compression algorithm.

In this embodiment, in the process that the UE is handed over from the source cell to the target cell, the SRNC sends, through the CN, the fourth identifier that is used to indicate the third compression algorithm or the first identifier that is used to indicate the compression algorithms supported by the UE to the DRNC. If the DRNC determines the first compression algorithm from the compression algorithms supported by the UE, the DRNC sends, through the CN, the second identifier that is used to indicate the first compression algorithm to the SRNC by setting the second identifier in the compression algorithm indication information, and the SRNC sends the compression algorithm indication information to the UE, so that the UE obtains the first compression algorithm that is determined by the DRNC. After the handover is completed, the UE may use the first compression algorithm to perform compression processing on the IP data in the IP data packet, thereby ensuring continuity of compressing the IP data packet.

If an inter-system handover occurs when the UE is handed over from the source cell to the target cell, compression algorithm indication information may be set in a Handover to UTRAN Command (Handover to UTRAN Command) sent by the network device to the UE, so that the UE obtains a changed compression algorithm, for example, when the UE is handed over from a GSM system to a WCDMA system, the network device may be a BSC. In this way, it may ensure that after the handover is completed, the UE may use the changed compression algorithm to perform compression processing on the IP data in the IP data packet, thereby ensuring continuity of compressing the IP data packet.

Figure 7:
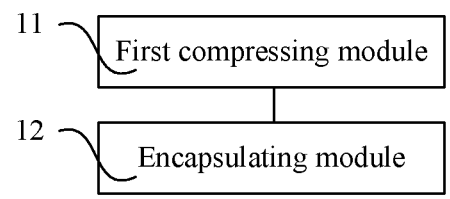
FIG. 7 is a schematic structural diagram of an apparatus for compressing an IP data packet according to a seventh embodiment of the present invention.

FIG. 7 is a schematic structural diagram of an apparatus for compressing an IP data packet according to a seventh embodiment of the present invention. As shown in FIG. 7, the network device includes a first compressing module 11 and an encapsulating module 12. The first compressing module 11 performs compression on IP data in an IP data packet according to a first compression algorithm; and the encapsulating module 12 encapsulates the IP data after the compression processing into a packet data convergence protocol (PDCP) data packet, where header information of the PDCP data packet includes identifier information, and the identifier information is used to indicate the first compression algorithm or indicate that the IP data is compressed.

The apparatus for compressing an IP data packet in this embodiment may be set in a first network device or a second network device. For the description about the first network device and the second network device, reference may be made to the foregoing first method embodiment.

The apparatus for compressing an IP data packet in this embodiment may be configured to execute the method for compressing an IP data packet provided in the first embodiment.

The apparatus for compressing an IP data packet in this embodiment may perform compression processing on the IP data in the IP data packet according to the first compression algorithm, and encapsulate the IP data after the compression processing into a PDCP data packet, so that compression of the IP data in the IP data packet is implemented. Therefore, an air interface resource is saved in a transmission process, a burden of air interface transmission is reduced, and network capacity is increased.

Figure 8:
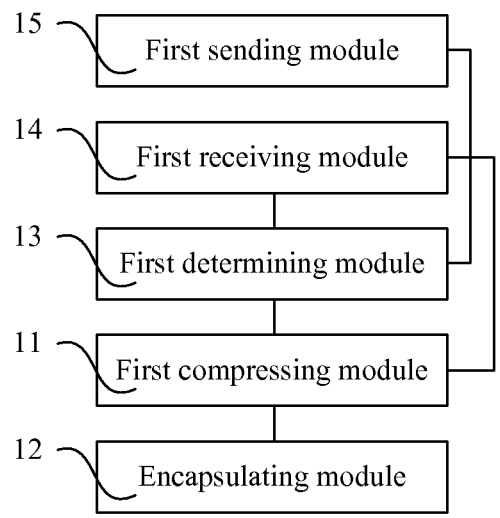
FIG. 8 is a schematic structural diagram of an apparatus for compressing an IP data packet according to an eighth embodiment of the present invention.

FIG. 8 is a schematic structural diagram of an apparatus for compressing an IP data packet according to an eighth embodiment of the present invention. As shown in FIG. 8, on the basis of the foregoing seventh embodiment, the apparatus may further include a first determining module 13, a first receiving module 14, and a first sending module 15. The first receiving module 14 receives a first identifier sent by a second device, where the first identifier is used to indicate compression algorithms supported by the second device; the first determining module 13 determines, according to the first identifier received by the first receiving module 14, a first compression algorithm from the compression algorithms supported by the second device, and a first compressing module 11 performs compression processing on IP data in an IP data packet according to the first compression algorithm determined by the first determining module 13; and the first sending module 15 may send a second identifier to the second device, where the second identifier is used to indicate the first compression algorithm determined by the first determining module 13.

In this embodiment, the apparatus for compressing an IP data packet may be set in a first device.

The apparatus for compressing an IP data packet in this embodiment may be configured to execute the method for compressing an IP data packet provided in the second embodiment.

The apparatus for compressing an IP data packet in this embodiment determines the first compression algorithm from the compression algorithms supported by the second device, sends the second identifier that indicates the first compression algorithm to the second device, performs compression processing on the IP data in the IP data packet according to the first compression algorithm, encapsulates the IP data after the compression processing into a PDCP data packet, and sends the PDCP data packet, so that compression of the IP data in the IP data packet is implemented. Therefore, an air interface resource is saved in a transmission process, a burden of air interface transmission is reduced, and network capacity is increased.

Figure 9:
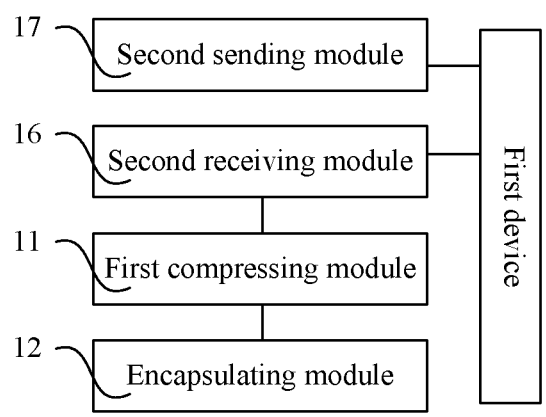
FIG. 9 is a schematic structural diagram of an apparatus for compressing an IP data packet according to a ninth embodiment of the present invention.

FIG. 9 is a schematic structural diagram of an apparatus for compressing an IP data packet according to a ninth embodiment of the present invention. As shown in FIG. 9, on the basis of the foregoing seventh embodiment, the apparatus may further include a second receiving module 16 and a second sending module 17. The second sending module 17 sends a first identifier to a first device, where the first identifier is used to indicate compression algorithms supported by a second device, so that the first device determines, according to the first identifier, a first compression algorithm from the compression algorithms supported by the second device; and the second receiving module 16 receives a second identifier sent by the first device, where the second identifier is used to indicate the first compression algorithm, and a first compressing module 11 performs compression processing on IP data in an IP data packet according to the first compression algorithm indicated by the second identifier, where the second identifier is received by the second receiving module 16.

In this embodiment, the apparatus for compressing an IP data packet may be set in the second device.

The apparatus for compressing an IP data packet in this embodiment may be configured to execute the method for compressing an IP data packet provided in the second embodiment.

The apparatus for compressing an IP data packet in this embodiment performs compression processing on the IP data in the IP data packet according to the first compression algorithm indicated by the received second identifier, and encapsulates the IP data after the compression processing into a PDCP data packet and sends the PDCP data packet, so that compression of the IP data in the IP data packet is imple-mented. Therefore, an air interface resource is saved in a transmission process, a burden of air interface transmission is reduced, and network capacity is increased.

Figure 10:
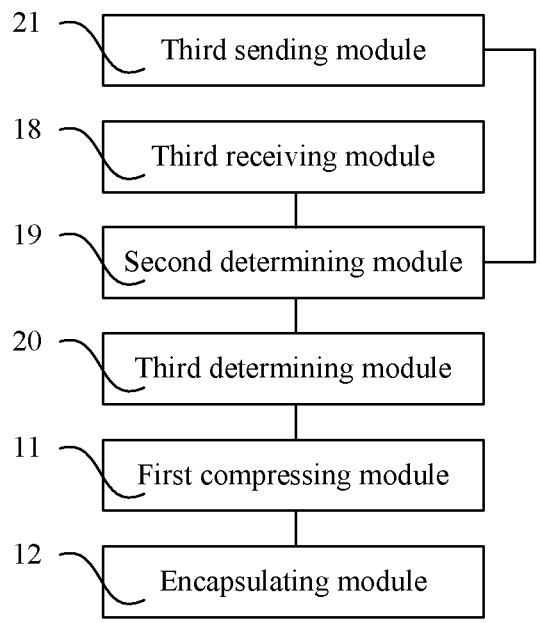
FIG. 10 is a schematic structural diagram of an apparatus for compressing an IP data packet according to a tenth embodiment of the present invention.

FIG. 10 is a schematic structural diagram of an apparatus for compressing an IP data packet according to a tenth embodiment of the present invention. As shown in FIG. 10, on the basis of the foregoing seventh embodiment, the apparatus may further include a third receiving module 18, a second determining module 19, a third determining module 20, and a third sending module 21. The third receiving module 18 receives a first identifier sent by a second device, where the first identifier is used to indicate compression algorithms supported by the second device; the second determining module 19 determines, according to the first identifier received by the third receiving module 18, compression algorithms that can be supported by both the first device and the second device from the compression algorithms supported by the second device; the third determining module 20 determines a first compression algorithm from the compression algorithms that can be supported by both the first device and the second device, where the compression algorithms that can be supported by both the first device and the second device are determined by the second determining module 19, and a first compressing module 11 performs compression processing on IP data in an IP data packet according to the first compression algorithm determined by the third determining module 20; and the third sending module 21 sends a third identifier to the second device, where the third identifier is used to indicate the compression algorithms that can be supported by both the first device and the second device, where the compression algorithms that can be supported by both the first device and the second device are determined by the second determining module 19, so that the second device determines, according to the third identifier, the first compression algorithm from the compression algorithms that can be supported by both the first device and the second device.

In this embodiment, the apparatus for compressing an IP data packet may be set in a first device.

The apparatus for compressing an IP data packet in this embodiment may be configured to execute the method for compressing an IP data packet provided in the third embodiment.

The apparatus for compressing an IP data packet in this embodiment may determine the compression algorithms that can be supported by both the first device and the second device from the compression algorithms supported by the second device, send the third identifier that indicates the compression algorithms that can be supported by both the first device and the second device to the second device, determine the first compression algorithm from the compression algorithms that can be supported by both the first device and the second device, perform compression processing on the IP data in the IP data packet according to the first compression algorithm, encapsulate the IP data after the compression processing into a PDCP data packet, and send the PDCP data packet, so that compression of the IP data in the IP data packet is implemented. Therefore, an air interface resource is saved in a transmission process, a burden of air interface transmission is reduced, and network capacity is increased.

Figure 11:
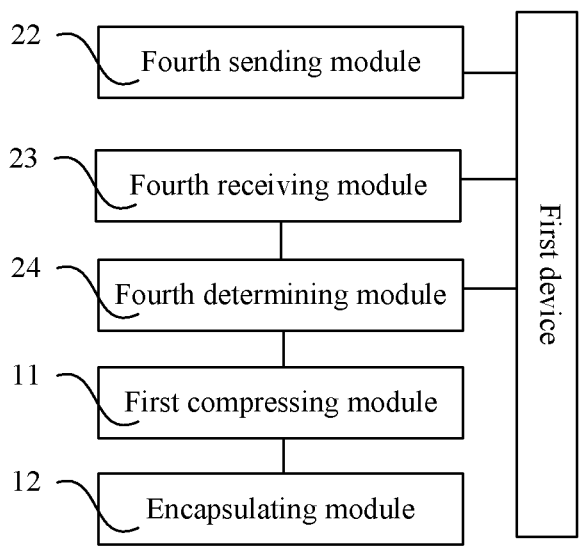
FIG. 11 is a schematic structural diagram of an apparatus for compressing an IP data packet according to an eleventh embodiment of the present invention.

FIG. 11 is an apparatus for compressing an IP data packet according to an eleventh embodiment of the present invention. As shown in FIG. 11, on the basis of the foregoing seventh embodiment, the apparatus may further include a fourth sending module 22, a fourth receiving module 23, and a fourth determining module 24. The fourth sending module 22 sends a first identifier to a first device, where the first identifier is used to indicate compression algorithms supported by a second device, so that the first device determines, according to the first identifier, compression algorithms that can be supported by both the first device and the second device from the compression algorithms supported by the second device; the fourth receiving module 23 receives a third identifier sent by the first device, where the third identifier is used to indicate the compression algorithms that can be supported by both the first device and the second device; and the fourth determining module 24 determines, according to the third identifier received by the fourth receiving module 23, a first compression algorithm from the compression algorithms than can be supported by both the first device and the second device, and a first compressing module 11 performs compression processing on IP data in an IP data packet according to the first compression algorithm determined by the fourth determining module 24.

In this embodiment, the apparatus for compressing an IP data packet may be set in the second device.

The apparatus for compressing an IP data packet in this embodiment may be configured to execute the method for compressing an IP data packet provided in the third embodiment.

The apparatus for compressing an IP data packet in this embodiment determines the first compression algorithm from the compression algorithms that can be supported by both the first device and the second device, where the compression algorithms that can be supported by both the first device and the second device are indicated by the received third identifier, performs compression processing on the IP data in the IP data packet according to the first compression algorithm, encapsulates the IP data after the compression processing into a PDCP data packet, and sends the PDCP data packet, so that compression of the IP data in the IP data packet is implemented. Therefore, an air interface resource is saved in a transmission process, a burden of air interface transmission is reduced, and network capacity is increased.

Figure 12:
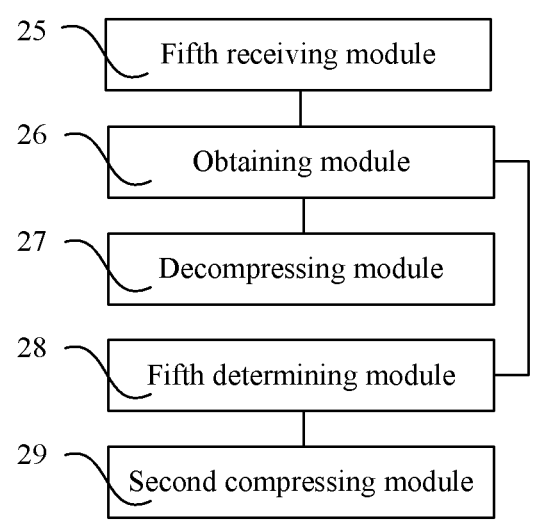
FIG. 12 is a schematic structural diagram of an apparatus for decompressing an IP data packet according to a twelfth embodiment of the present invention.

FIG. 12 is a schematic structural diagram of an apparatus for decompressing an IP data packet according to a twelfth embodiment of the present invention. As shown in FIG. 12, the apparatus includes: a fifth receiving module 25, an obtaining module 26, and a decompressing module 27.

The fifth receiving module 25 receives a PDCP data packet sent by a second device, where header information of the PDCP data packet includes identifier information, and the identifier information is used to indicate a first compression algorithm; the obtaining module 26 obtains, according to the identifier information in the header information of the PDCP data packet, the first compression algorithm; and the decompressing module 27 performs decompression processing on IP data in the PDCP data packet according to the first compression algorithm.

Further, the apparatus in this embodiment may include a fifth determining module 28 and a second compressing module 29. The fifth determining module 28 determines a second compression algorithm according to a first mapping relationship and the first compression algorithm, where the first mapping relationship includes a mapping relationship between the first compression algorithm and the second compression algorithm; and the second compressing module 29 performs, according to the second compression algorithm, compression processing on IP data in an IP data packet, where the IP data packet is sent to the second device.

In this embodiment, the apparatus for decompressing an IP data packet may be set in a first device.

The apparatus for decompressing an IP data packet in this embodiment may be configured to execute the method for decompressing an IP data packet provided in the fourth or fifth embodiment.

The apparatus for decompressing an IP data packet in this embodiment obtains, according to the identifier information in the header information of the received PDCP data packet, the first compression algorithm, and performs decompression processing on the IP data in the PDCP data packet according to the first compression algorithm. Because the IP data in the PDCP data packet is IP data on which compression processing is performed according to the first compression algorithm, an air interface resource is saved in a transmission process, a burden of air interface transmission is reduced, and network capacity is increased. After obtaining the first compression algorithm, the apparatus for decompressing an IP data packet in this embodiment may query and find, according to the mapping relationship between the first compression algorithm and the second compression algorithm, the second compression algorithm that is corresponding to the first compression algorithm, perform compression processing on the IP data in the IP data packet according to a second specified compression algorithm, encapsulate the IP data after the compression processing into a PDCP data packet, and send the PDCP data packet, so that compression of the IP data in the IP data packet is implemented. Therefore, an air interface resource is saved in a transmission process, a burden of air interface transmission is reduced, and network capacity is increased. The apparatus for decompressing an IP data packet in this embodiment may obtain the second compression algorithm by querying the mapping relationship between the first compression algorithm and the second compression algorithm without executing a process of determining the second compression algorithm, thereby avoiding consumption of a resource of the first device.

Those skilled in the art may understand that all or part of the steps in the foregoing method embodiments may be implemented by a program instructing relevant hardware. The foregoing program may be stored in a computer readable storage medium and when the program is executed, the steps in the foregoing method embodiments are executed. The foregoing storage medium may be any medium that is capable of storing program codes, such as a ROM, a RAM, a magnetic disk, or an optical disk.

Finally, it should be noted that the foregoing embodiments are only used to describe the technical solutions of the present invention, but are not intended to limit the technical solutions of the present invention. Although the present invention is described in detail with reference to the foregoing embodiments, persons of ordinary skill in the art should understand that they may still make modifications to the technical solutions described in the foregoing embodiments or make equivalent replacements to some technical features of the technical solutions, however, these modifications or equivalent replacements do not make the essence of the corresponding technical solutions depart from the spirit and scope of the technical solutions in the embodiments of the present invention.

What is claimed is:

1. A method for compressing an IP data packet, comprising:

determining, by a first device which is a network device, a first compression algorithm from compression algorithms supported by a second device which is a terminal or from compression algorithms supported by both the network device and the terminal, to perform, by the network device, compression processing on IP data in an IP data packet according to the first compression algorithm; and encapsulating, by the network device, the IP data after the compression processing into a packet data convergence protocol (PDCP) data packet, wherein header information of the PDCP data packet comprises identifier information to indicate the network device determined first compression algorithm used to compress the IP data, wherein:

when the network device is a network device of a target cell, in a process that the terminal is handed over from a source cell to the target cell, the method further comprises:

receiving, by the network device of the target cell, a second identifier, wherein the second identifier is used to indicate a second compression algorithm, wherein the second compression algorithm is a compression algorithm used by the terminal in the source cell; and when the network device of the target cell does not support the second compression algorithm, determining, by the network device of the target cell and according to a first identifier sent by the terminal, the first compression algorithm from the compression algorithms supported by the terminal.

2. The method according to claim 1, wherein before the performing, by the network device, compression processing on the IP data in the IP data packet according to the first compression algorithm, the method further comprises:

receiving, by the network device, the first identifier sent by the terminal, wherein the first identifier is used to indicate compression algorithms supported by the terminal; and determining, by the network device and according to the first identifier, the first compression algorithm from the compression algorithms supported by the terminal; and after the determining, by the network device and according to the first identifier, the first compression algorithm from the compression algorithms supported by the terminal, the method further comprises:

sending, by the network device, a third identifier to the terminal, wherein the third identifier is used to indicate the first compression algorithm.

3. The method according to claim 2, wherein:

the receiving, by the network device, the first identifier sent by terminal comprises:

receiving, by the network device, the first identifier that is sent by the terminal through a radio resource control (RRC) message; and the sending, by the network device, the third identifier to the terminal comprises:

sending, by the network device, the third identifier to the second terminal through an RRC message.

4. The method according to claim 2, wherein: the determining, by the network device and according to the first identifier, the first compression algorithm from the compression algorithms supported by the terminal comprises:

determining, by the network device and according to the first identifier and configuration information of the first compression algorithm, the first compression algorithm from the compression algorithms supported by the terminal; and the configuration information of the first compression algorithm comprises one or any combination of the following: compression algorithms that can be processed by the network device, consumption of resources of the network device by compression algorithms, and priorities of compression algorithms.

5. The method according to claim 1, wherein before the performing, by the network device, compression processing on the IP data in the IP data packet according to the first compression algorithm, the method further comprises:

receiving, by the network device, the first identifier sent by the terminal, wherein the first identifier is used to indicate compression algorithms supported by the terminal;

determining, by the network device and according to the first identifier, compression algorithms that can be supported by both the network device and the terminal from the compression algorithms supported by the terminal;

sending, by the network device, a fourth identifier to the terminal, wherein the fourth identifier is used to indicate the compression algorithms that can be supported by both the network device and the terminal; and determining, by the network device, the first compression algorithm from the compression algorithms that can be supported by both the network device and the terminal.

6. The method according to claim 5, wherein:

the determining, by the network device and according to the first identifier, compression algorithms that can be supported by both the network device and the terminal from the compression algorithms supported by the terminal comprises:

determining, by the network device and according to configuration information of a third compression algorithm and the first identifier, compression algorithms that can be supported by both the network device and the terminal from the compression algorithms supported by the terminal, wherein the configuration information of the third compression algorithm comprises one or any combination of compression algorithms that can be processed by the network device, consumption of resources of the network device by compression algorithms and priorities of compression algorithms.

7. The method according to claim 1, wherein: the header information comprises a PDCP header and an IP header of the IP data packet; and the identifier information is set in the PDCP header or the IP header.

8. The method according to claim 7, wherein the identifier information is set in a reserved bit or extended bit of a packet identifier (PID) of the PDCP header.

9. A method for decompressing an IP data packet, comprising:

receiving, by a first device which is a network device, a packet data convergence protocol (PDCP) data packet sent by a second device which is a terminal, wherein header information of the PDCP data packet comprises identifier information to indicate a first compression algorithm used to compress IP data;

obtaining, by the network device and according to the identifier information in the header information of the PDCP data packet, the first compression algorithm; and performing, by the network device, decompression processing on the IP data in the PDCP data packet according to the first compression algorithm, wherein the network device determines the first compression algorithm from compression algorithms supported by the terminal or from compression algorithms supported by both the network device and the terminal and header information of a PDCP data packet comprises identifier information to indicate, to the terminal, the network device determined first compression algorithm used to compress IP data in an IP data packet for sending to the terminal, wherein:

when the network device is a network device of a target cell, in a process that the terminal is handed over from a source cell to the target cell, the method further comprises:

receiving, by the network device of the target cell, a second identifier, wherein the second identifier is used to indicate a second compression algorithm, wherein the second compression algorithm is a compression algorithm used by the terminal in the source cell; and when the network device of the target cell does not support the second compression algorithm, determining, by the network device of the target cell and according to a first identifier sent by the terminal, the first compression algorithm from the compression algorithms supported by the terminal.

10. The method according to claim 9, further comprising:

determining, by the network device, a third compression algorithm according to a mapping relationship between the first compression algorithm and the third compression algorithm; and performing, by the network device and according to the third compression algorithm, compression processing on IP data in an IP data packet, wherein the IP data packet is sent to the terminal.

11. An apparatus as a first device for compressing an IP data packet, comprising:

a non-transitory computer readable storage medium to store program(s), and computer hardware configured to implement, including configured by the program(s) to implement:

a compressing module, configured to determine a first compression algorithm from compression algorithms supported by a second device or from compression algorithms supported by both the first device and the second device, to perform compression processing on IP data in an IP data packet according to the first compression algorithm; and an encapsulating module, configured to encapsulate the IP data after the compression processing into a packet data convergence protocol (PDCP) data packet, wherein header information of the PDCP data packet comprises identifier information to indicate the determined first compression algorithm used to compress the IP data, wherein:

when the first device is a network device of a target cell, in a process that the second device is handed over from a source cell to the target cell, the method further comprises:

receiving, by the first device of the target cell, a second identifier, wherein the second identifier is used to indicate a second compression algorithm, wherein the second compression algorithm is a compression algorithm used by the second device in the source cell; and when the first device of the target cell does not support the second compression algorithm, determining, by the first device of the target cell and according to a first identifier sent by the second device, the first compression algorithm from the compression algorithms supported by the second device.

12. The apparatus according to claim 11, the computer hardware is further configured to implement:

a receiving module, configured to receive the first identifier sent by the second device, wherein the first identifier is used to indicate compression algorithms supported by the second device;

a first determining module, configured to determine, according to the first identifier received by the first receiving module, the first compression algorithm from the compression algorithms supported by the second device; and a first sending module, configured to send a third identifier to the second device, wherein the third identifier is used to indicate the first compression algorithm determined by the first determining module.

13. The apparatus according to claim 11, wherein the computer hardware is further configured to implement:

a second determining module, configured to determine, according to the first identifier, compression algorithms that can be supported by both the first device and the second device from the compression algorithms supported by the second device;

a third determining module, configured to determine the first compression algorithm from the compression algorithms that can be supported by both the first device and the second device, wherein the compression algorithms that can be supported by both the first device and the second device are determined by the second determining module, so that the compressing module performs compression processing on the IP data in the IP data packet according to the first compression algorithm determined by the third determining module; and a third sending module, configured to send a fourth identifier to the second device, wherein the fourth identifier is used to indicate the compression algorithms that can be supported by both the first device and the second device, wherein the compression algorithms that can be supported by both the first device and the second device are determined by the second determining module, so that the second device determines, according to the fourth identifier, the first compression algorithm from the compression algorithms that can be supported by both the first device and the second device.

14. An apparatus as a first device for decompressing an IP data packet, comprising:

a non-transitory computer readable storage medium to store program(s), and computer hardware configured to implement, including configured by the program(s) to implement modules to:

receive a packet data convergence protocol (PDCP) data packet sent by a second device, wherein header information of the PDCP data packet comprises identifier information to indicate a first compression algorithm used to compress the IP data;

obtain, according to the identifier information in the header information of the PDCP data packet, the first compression algorithm; and to perform decompression processing on the IP data in the PDCP data packet according to the first compression algorithm, wherein the first device determines the first compression algorithm from compression algorithms supported by the second device or from compression algorithms supported by both the first device and the second and header information of a PDCP data packet comprises identifier information to indicate, to the second device, the determined first compression algorithm used to compress IP data in an IP data packet for sending to the second device, wherein:
when the first device is a network device of a target cell, in a process that the second device is handed over from a source cell to the target cell, the method further comprises:
receiving, by the first device of the target cell, a second identifier, wherein the second identifier is used to indicate a second compression algorithm, wherein the second compression algorithm is a compression algorithm used by the second device in the source cell; and
when the first device of the target cell does not support the second compression algorithm, determining, by the first device of the target cell and according to a first identifier sent by the second device, the first compression algorithm from the compression algorithms supported by the second device.

15. The apparatus as the second device according to claim 14, the computer hardware is further configured to implement modules to:
determine a third compression algorithm according to a mapping relationship between the first compression algorithm and the third compression algorithm; and
perform compression processing on IP data in an IP data packet according to the third compression algorithm, wherein the IP data packet is sent to the second device.

* * * * *

UNITED STATES PATENT AND TRADEMARK OFFICE
CERTIFICATE OF CORRECTION

PATENT NO. : 8,971,267 B2  
APPLICATION NO. : 13/547748  
DATED : March 3, 2015  
INVENTOR(S) : Chen et al.

Page 1 of 1

It is certified that error appears in the above-identified patent and that said Letters Patent is hereby corrected as shown below:

On the title page item [56], Column 2, Lines 13-14

Delete "pp. Jan 1671", and insert --pp. 1-1671--, therefor.

Signed and Sealed this
Thirtieth Day of June, 2015

Michelle K. Lee
*Director of the United States Patent and Trademark Office*